(12) United States Patent
Brekelmans

(10) Patent No.: US 7,583,112 B2
(45) Date of Patent: Sep. 1, 2009

(54) FREQUENCY-DIVISION CIRCUIT

(75) Inventor: Johannes H. A. Brekelmans, Nederweert (NL)

(73) Assignee: NXP B.V., Eindhoven (NL)

( * ) Notice: Subject to any disclaimer, the term of this patent is extended or adjusted under 35 U.S.C. 154(b) by 22 days.

(21) Appl. No.: 11/573,347

(22) PCT Filed: Jul. 26, 2005

(86) PCT No.: PCT/IB2005/052515

§ 371 (c)(1),
(2), (4) Date: Nov. 21, 2007

(87) PCT Pub. No.: WO2006/018754

PCT Pub. Date: Feb. 23, 2006

(65) Prior Publication Data

US 2008/0170652 A1    Jul. 17, 2008

(30) Foreign Application Priority Data

Aug. 13, 2004    (EP)    ................... 04103912

(51) Int. Cl.
*H03B 19/00* (2006.01)
(52) U.S. Cl. ....................... 327/117; 327/115
(58) Field of Classification Search ................. 327/115, 327/117, 218; 377/47–48
See application file for complete search history.

(56) References Cited

U.S. PATENT DOCUMENTS

| 3,571,728 | A |   | 3/1971 | Andrea et al. |
|---|---|---|---|---|
| 5,097,230 | A |   | 3/1992 | Lautzenhiser et al. |
| 5,327,019 | A |   | 7/1994 | Kluck et al. |
| 5,339,345 | A | * | 8/1994 | Mote, Jr. .................... 377/48 |
| 2003/0132791 | A1 | * | 7/2003 | Hsieh ........................ 327/218 |
| 2003/0169841 | A1 |   | 9/2003 | Van Der Valk |

FOREIGN PATENT DOCUMENTS

| JP | 01133416 | A | * | 5/1989 |
|---|---|---|---|---|
| JP | 08056140 | A | * | 2/1996 |

* cited by examiner

*Primary Examiner*—Quan Tra

(57) ABSTRACT

A frequency-division circuit comprises a pair of multi-state circuits (MSCA, MSCB). Each multi-state circuit can be switched throughout a cycle of states (SA(1), ..., SA(N); SB(1), ..., SB(N)). One multi-state circuit (MSCA) switches to a next state in response to a rising edge (Er) in an input signal (OS). The other multi-state circuit (MSCB) switches to a next state in response to a falling edge (Ef) in the input signal (OS). Each multi-state circuit (MSCA, MSCB) has at least one state (SA(1), SB(1)) in which the multi-state circuit inhibits the other multi-state circuit (MSCB, MSCA) so as to prevent the other multi-state circuit from switching to the next state.

12 Claims, 16 Drawing Sheets

FREQUENCY-DIVISION CIRCUIT

FIELD OF THE INVENTION

An aspect of the invention relates to a frequency-division circuit. Other aspects of the invention relate to a method of frequency division and a signal processing arrangement that comprises a frequency-division circuit. The signal processing arrangement may be, for example, a receiver for processing a radiofrequency signal that conveys information in the form of audio, video, or data or any combination of those. Yet another aspect of the invention relates to an information-rendering apparatus that comprises such a signal processing arrangement. The information-rendering apparatus may be, for example, a video display set.

BACKGROUND OF THE INVENTION

U.S. Pat. No. 4,866,741 describes a 3/2 frequency divider. The frequency divider comprises two D flip-flops. Each D flip-flop has a D input, a clock input, a Q output and a Q-not output. One flip-flop receives an input signal at its clock input, the other flip-flop receives the inverse of the input signal at its clock input. A logic circuit, which is in the form of an OR gate, is responsive to the Q-not output of each flip-flop. The logic circuit provides a low-state signal to the D input of each flip-flop when the Q-not output of at least one flip-flop provides a low-state signal. The logic circuit provides a high-state signal to the D input of each flip-flop when the Q-not output of each flip-flop provides a high-state signal. A further logic circuit, which is in the form of an AND circuit, is responsive to the Q output of each flip-flop and provides an output signal. The output signal has a frequency that is ⅔ times the frequency of the input signal.

SUMMARY OF THE INVENTION

It is an object of the invention to allow a reduction of power consumption at a given frequency and/or to allow a higher frequency at the same power consumption. The invention is defined by the independent claims. The dependent claims define advantageous embodiments.

According to an aspect of the invention, a frequency-division circuit comprises the following characteristics. The frequency-division circuit comprises a pair of multi-state circuits, each of which can be switched throughout a cycle of states. One multi-state circuit switches to a next state in response to a rising edge in an input signal. The other multi-state circuit switches to a next state in response to a falling edge in the input signal. Each multi-state circuit has at least one state in which the multi-state circuit inhibits the other multi-state circuit so as to prevent the other multi-state circuit from switching to the next state.

The invention takes the following aspects into consideration. A frequency divider typically comprises a multi-state circuit composed of, for example, one or more flip-flop circuits. The multi-state circuit receives an input signal with successive rising edges and successive falling edges. The multi-state circuit may switch from one state to another state in response to a rising edge or a falling edge. An output circuit derives an output signal from the multi-state circuit. For example, the output signal may have a low level for one or more states, whereas the output signal has a high level for one or more different states. Accordingly, the output signal has a frequency that is a submultiple of the frequency of the input signal.

In the prior-art 3/2 frequency divider identified hereinbefore, each flip-flop constitutes a two-state circuit. At the occurrence of a rising edge, one flip-flop takes a decision, as it were, what its next state will be. The other flip-flop takes such a decision at the occurrence of a falling edge. Each decision on the next state is based on a feedback signal that is present at the D input of the flip-flop concerned. The feedback signal depends on the signal at the Q output of each flip-flop. Consequently, for each decision, the state of each flip-flop must be evaluated so as to derive therefrom a desired new state. This evaluation and decision process, which takes a certain time, imposes a high-frequency limit beyond which frequencies are no longer correctly divided. In principle, it is possible to speed up the evaluation and decision process by increasing the speed of the logic circuitry that is involved in this process, which is the OR gate in the 3/2 frequency divider. However, such a speed increase will generally be at the expense of higher power consumption. Consequently, the prior-art 3/2 frequency divider will need to consume relatively much power in order to divide relatively high frequencies.

In accordance with the above-described aspect of the invention, each multi-state circuit switches throughout a cycle of states and has at least one state in which the multi-state circuit inhibits the other multi-state circuit so as to prevent the other multi-state circuit from switching to the next state.

The principle of operation is thus that a multi state circuit is from time to time inhibited to switch to the next state. The next state is by definition defined by the cycle of states. Accordingly, there is no evaluation and decision process in order to determine what the next state will be. The inhibiting operation in accordance with the invention can be significantly faster than the prior art evaluation and decision process for a given power consumption. Consequently, the invention allows a higher frequency limit for a given power consumption. Conversely, the invention allows a reduction in power consumption for given frequency.

These and other aspects of the invention will be described in greater detail hereinafter with reference to drawings.

DETAILED DESCRIPTION

Figure 1:
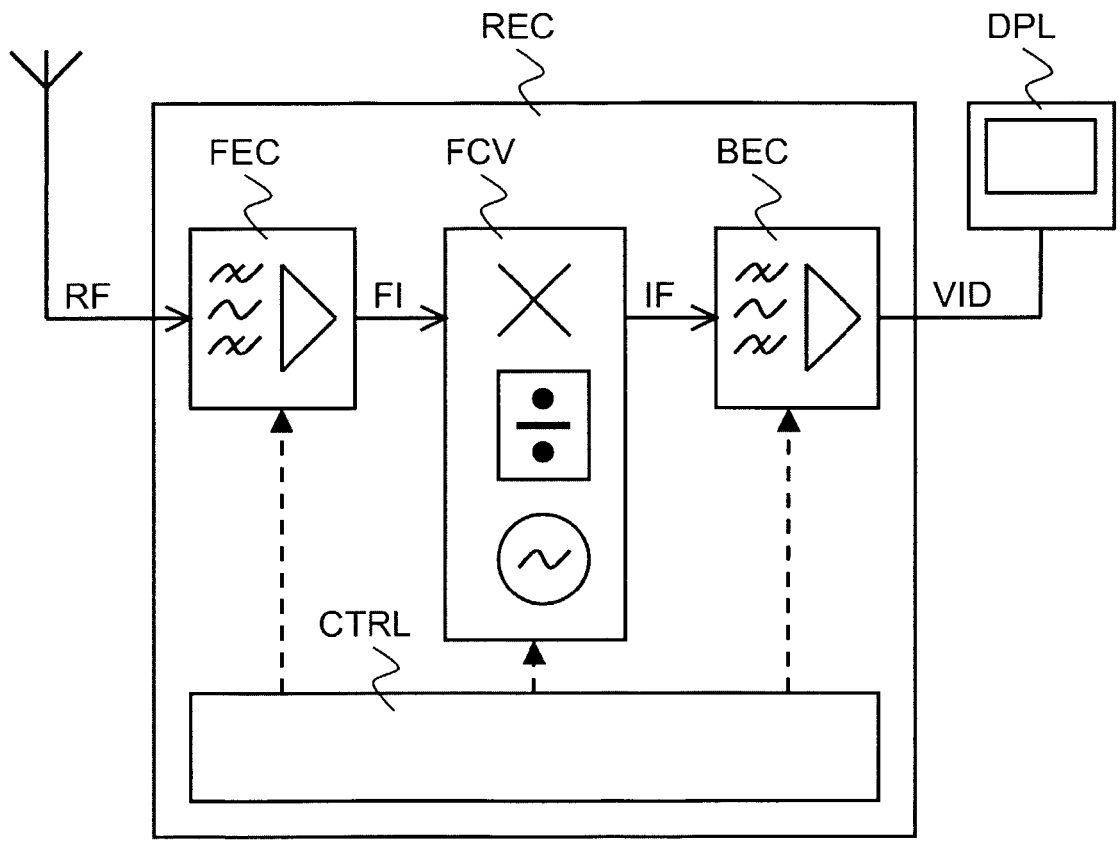
FIG. 1 is a block diagram that illustrates a video display set.

FIG. 1 illustrates a video display set VDS that comprises a receiver REC and a display device DPL. The receiver REC receives a radiofrequency signal RF and provides in response thereto a video signal VID. The display device DPL displays the video signal VID.

The receiver REC comprises a front-end circuit FEC, a frequency conversion circuit FCV, a back-end circuit BEC, and a control circuit CTRL. The front-end circuit FEC filters and amplifies the radiofrequency signal RF so as to obtain a frequency-conversion input signal FI. The frequency conversion circuit FCV carries out a frequency conversion so as to obtain an intermediate frequency signal IF. The intermediate frequency signal IF is a frequency-shifted version of the frequency-conversion input signal FI and thus a frequency-shifted version of the radiofrequency signal RF. The back-end circuit BEC selects a certain portion of the frequency spectrum of the intermediate frequency signal IF. The back-end circuit BEC processes that portion of the frequency spectrum so as to obtain the video signal VID to be displayed on the display device DPL.

Figure 2:
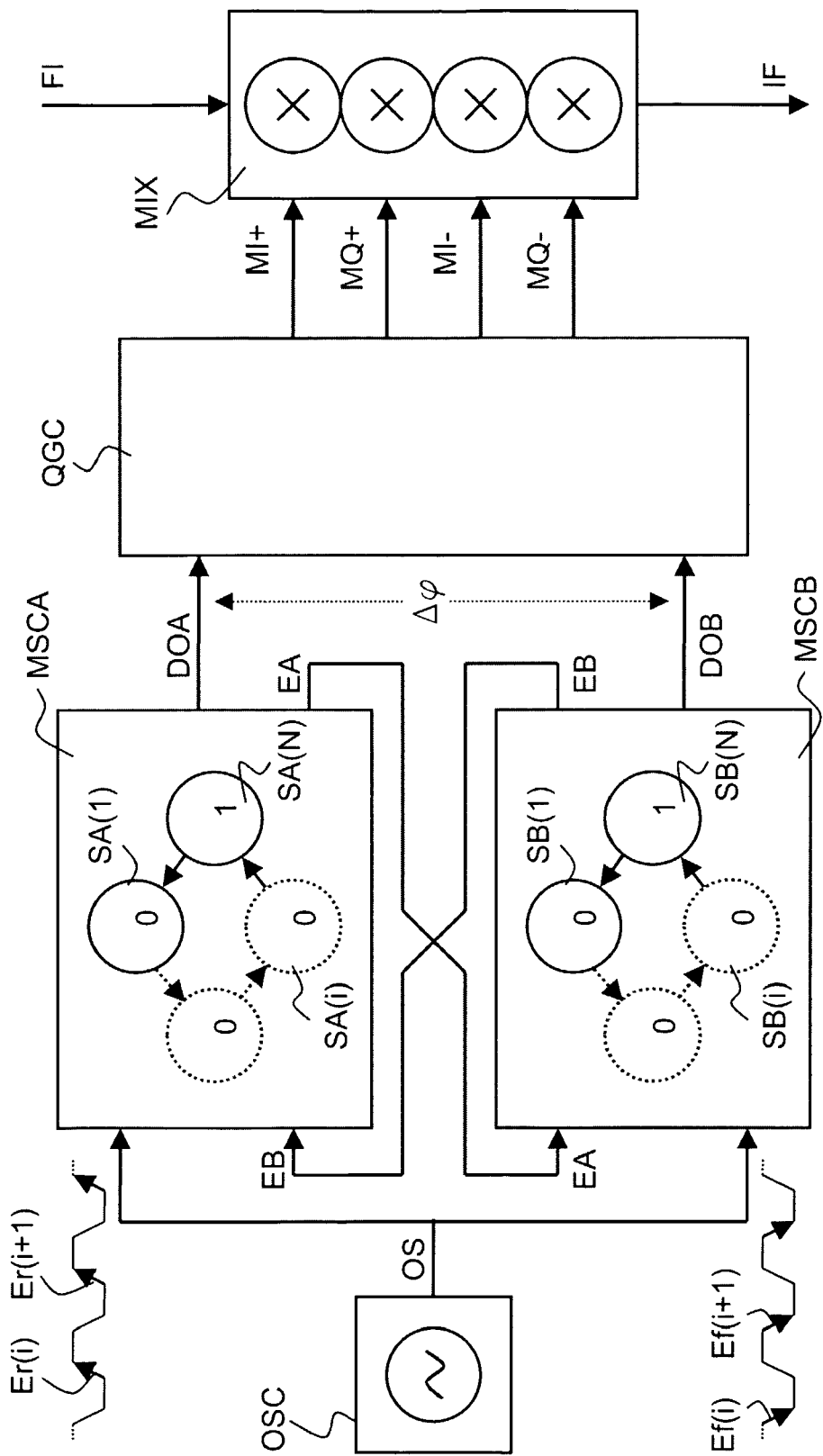
FIG. 2 is a block diagram that illustrates a frequency conversion circuit that forms part of the video display set.

FIG. 2 illustrates the frequency conversion circuit FCV. The frequency conversion circuit FCV comprises an oscillator circuit OSC, a pair of multi-state circuits MSCA, MSCB, a quadrature generation circuit QGC, and a mixer circuit MIX. Multi-state circuit MSCA can be switched through a cycle of N different states SA(1), . . . , SA(N), N being an integer. Multi-state circuit MSCB can also be switched through a cycle of N different states SB(1), . . . , SB(N). In FIG. 2, a circle represents a state.

Multi-state circuit MSCA and multi-state circuit MSCB provide enable signals EA and EB, respectively. Enable signal EA has a binary value that depends on the state in which the multi-state circuit MSCA is. The binary value is indicated in the circle that represents the state concerned. Accordingly, FIG. 2 illustrates that enable signal EA is '0' (zero) for all states except state SA(N). In state SA(N), the enable signal is '1' (one). The same applies to multi-state circuit MSCB: enable signal EB is '1' in state SB(N) and '0' in all the other states. FIG. 2 further illustrates that multi-state circuit MSCA receives enable signal EB that multi-state circuit MSCB provides. Multi-state circuit MSCB receives the enable signal EA that multi-state circuit MSCA provides.

The frequency conversion circuit FCV operates as follows. The oscillator circuit OSC produces an oscillator signal OS that comprises rising edges Er and falling edges Ef Multi-state circuit MSCA is responsive to the rising edges Er, whereas multi-state circuit MSCB is responsive to the falling edges Ef. Multi-state circuit MSCA switches from a current state to the next state when a rising edge Er occurs if and only if enable signal EB is '1'. Likewise, multi-state circuit MSCB switches from a current state to the next state when a falling edge Ef occurs if and only if enable signal EA is '1'. Each multi-state circuit is thus prevented from switching to the next state when the enable signal that the other multi-state circuit provides, is '0'. Accordingly, the pair of multi-state circuits MSCA, MSCB provides a pair of frequency-divided signals DOA, DOB, which have certain phase relationship $\Delta\phi$ with respect to each other. Each frequency-divided signals has a frequency that is 2N−1 times lower than the frequency of the oscillator signal OS. For example, let it be assumed that each multi-state circuit has a cycle of 4 states. In that case, each frequency-divided signal will have frequency that is 1/7 of the oscillator signal OS frequency (N=4; 2N−1=7).

The quadrature generation circuit QGC derives a set of 4 quadrature mixer signals MI+, MQ+, MI−, MQ− from the pair of frequency-divided signals. The set of 4 quadrature mixer signals MI+, MQ+, MI−, MQ− have the following phase relationship: 0°, 90°, 180°, and 270°. Quadrature mixer signals MI+, MQ+, MI−, and MQ− can be associated with a 0°, 90°, 180°, and 270° phase condition, respectively. In effect, the set of 4 quadrature mixer signals MI+, MQ+, MI−, MQ− constitute a vectorial signal that can either have a positive or a negative frequency.

The mixer circuit MIX mixes the frequency conversion input signal FI with the set of 4 quadrature mixer signals MI+, MQ+, MI−, MQ−. Accordingly, the intermediate frequency signal IF is obtained. The mixer circuit MIX preferably has a double quadrature architecture as described in, for example, the article "a 48-860 MHz digital cable tuner IC with integrated RF and IF selectivity" by Jan van Sinderen et al., ISSCC2003, session 25, RF infotainment, paper 25.3. Such a mixer circuit allows a satisfactory suppression of unwanted signals at so-called image frequencies.

Figure 3:
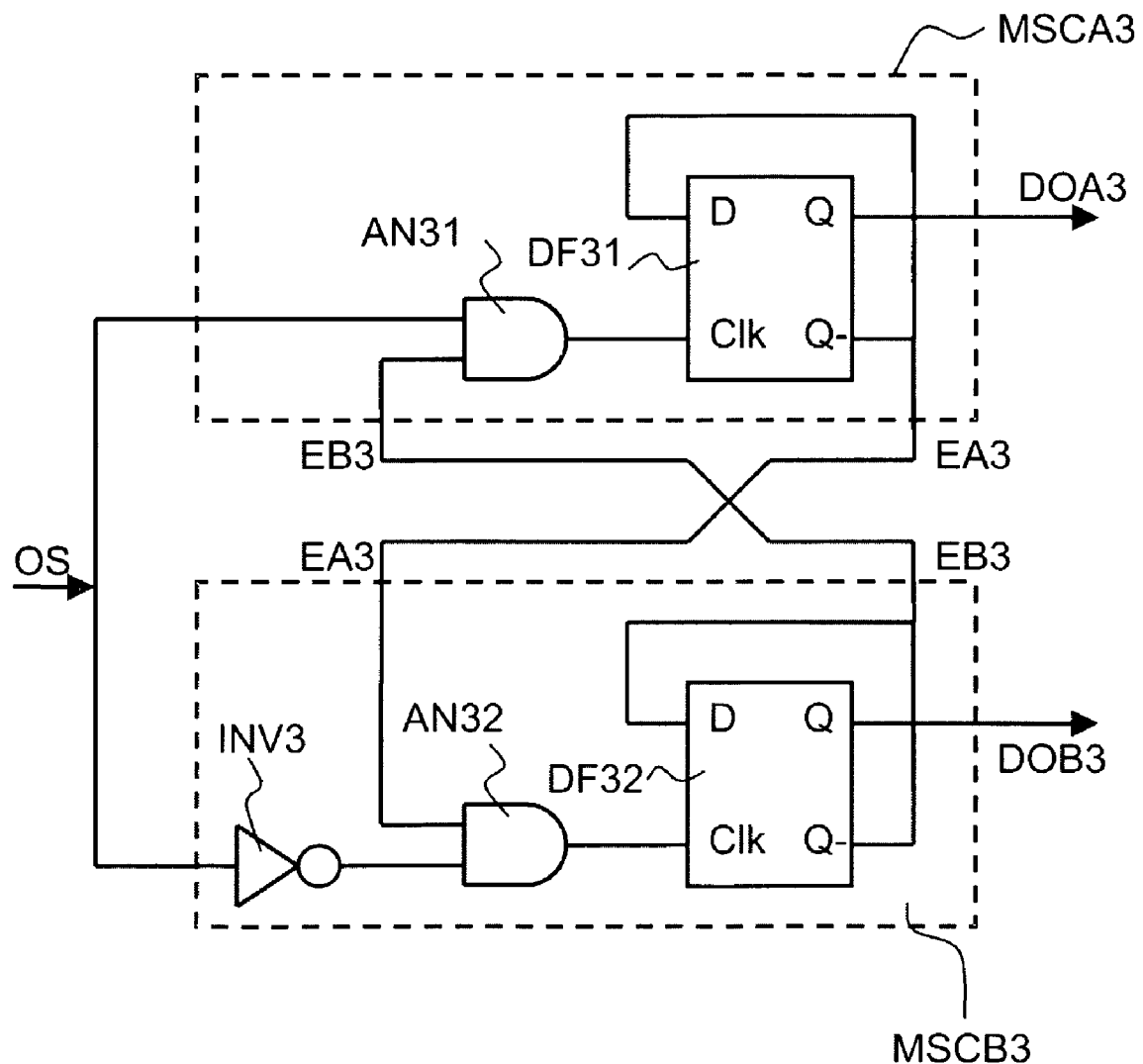
FIG. 3 is a circuit diagram that illustrates a pair of two-state circuits for the frequency conversion circuit.
Figure 6:
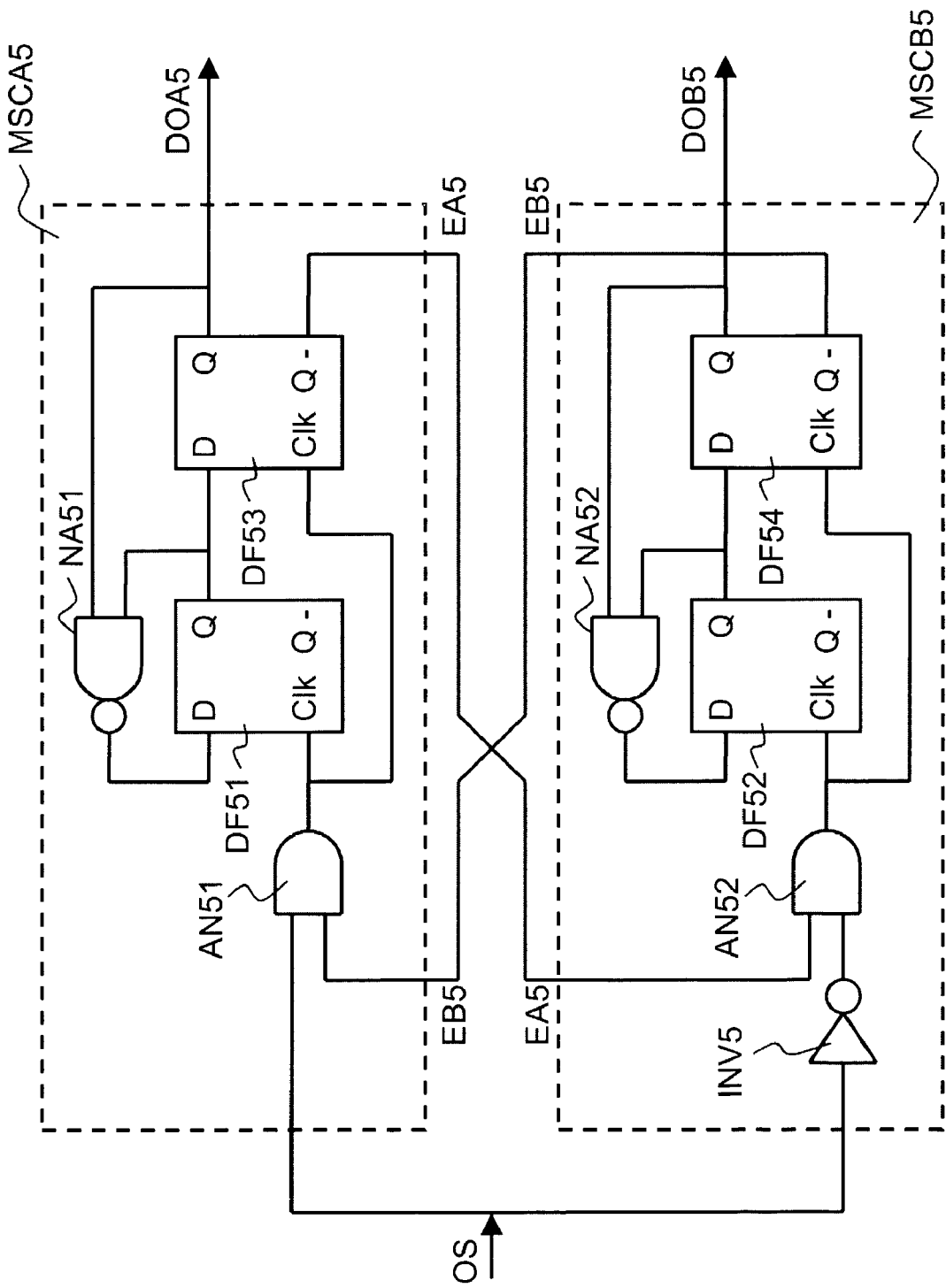
FIG. 6 is a circuit diagram that illustrates a pair of three-state circuits for the frequency conversion circuit.
Figure 9:
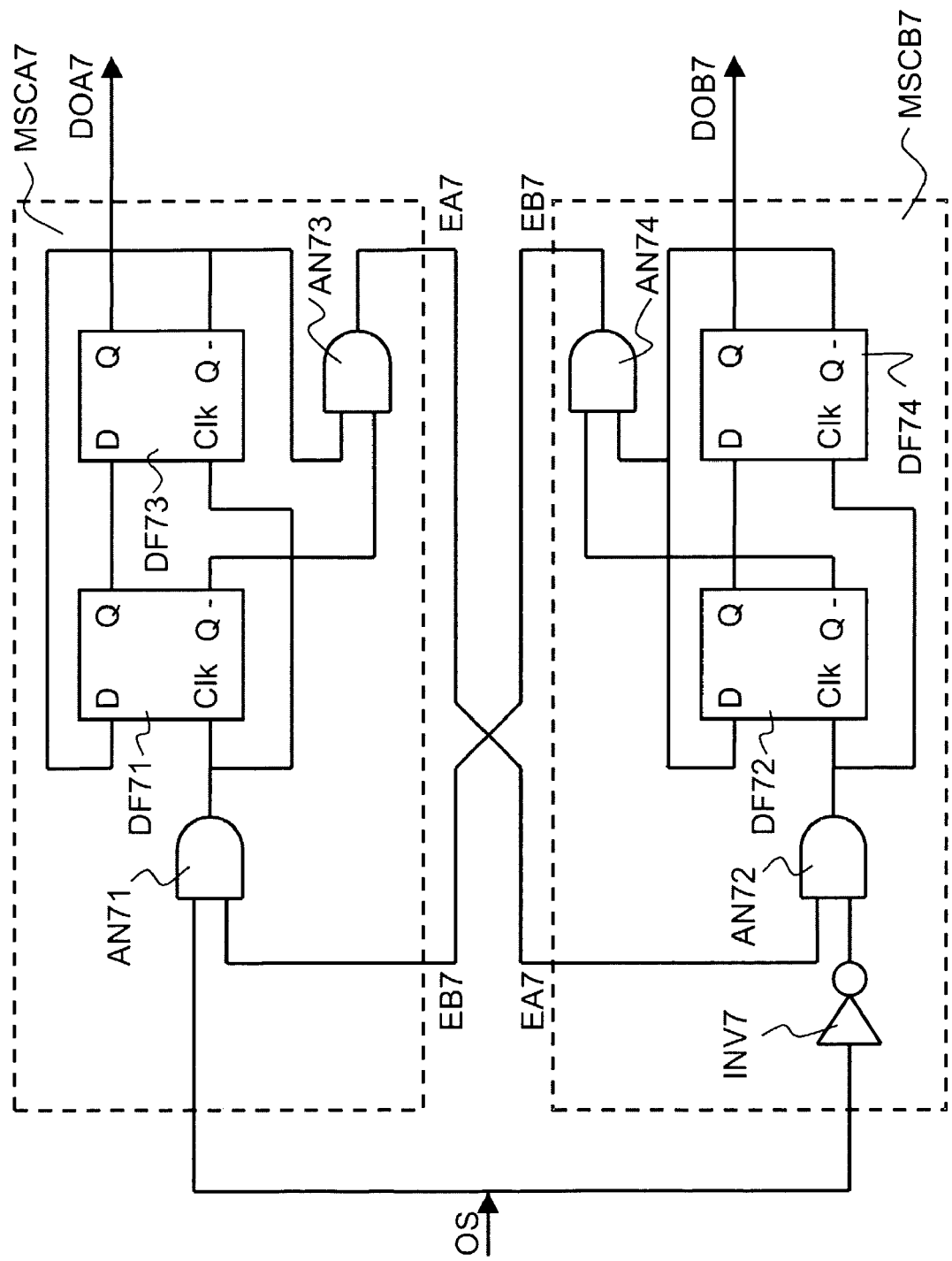
FIG. 9 is a circuit diagram that illustrates a pair of four-state circuits for the frequency conversion circuit.

FIGS. 3, 6, and 9 illustrates various pairs of multi-state circuits that provide frequency division ratios of 3, 5, and 7, respectively. As explained hereinbefore, a pair of two-state circuits provides a frequency division ratio of 3, which is illustrated in FIG. 3. A pair of three-state circuits provides a frequency division ratio of 5, which is illustrated in FIG. 6. A pair of four-state circuits provides a frequency division ratio of 7, which is illustrated in FIG. 9.

FIG. 3 illustrates a pair of multi-state circuits MSCA3, MSCB3 that provides a frequency division ratio of 3. The numeral 3 is used in the reference signs to indicate the frequency division ratio concerned. For example, numeral 3 has been added to the reference signs DOA and DOB illustrated in FIG. 2 so as to indicate that the frequency-divided signals have frequency that is 3 times lower than that of the oscillator signal OS.

Multi-state circuit MSCA3 comprises a flip-flop circuit DF31, and an and-gate AN31. Multi-state circuit MSCB3 comprises a flip-flop circuit DF32, an and-gate AN32, and an inverter INV3. Each flip-flop circuit DF is of the "d"-type and has a data input D, a clock input Clk, an output Q and an inverted output Q−. Each flip-flop circuit DF is responsive to a rising edge at the clock input. Inverter INV3 converts a falling edge in the oscillator signal OS into a rising edge.

And-gates AN31, AN32 can be considered to operate as switches under the control of enable signals EB3, EA3, respectively. Flip-flop circuit DF31 receives the oscillator signal OS when enable signal EB3 is '1'. Accordingly, flip-flop circuit DF31 will be responsive to a rising edge in the oscillator signal OS. In contradistinction, flip-flop circuit DF31 will not be responsive to the oscillator signal OS when enable signal EB3 is '0'. Likewise, flip-flop circuit DF32 receives the oscillator signal OS when enable signal EA3 is '1'. Accordingly, flip-flop circuit DF32 will be responsive to a falling edge in the oscillator signal OS because of inverter INV3. Flip-flop circuit DF32 will not be responsive to the oscillator signal OS when enable signal EA3 is '0'.

Figure 4A:
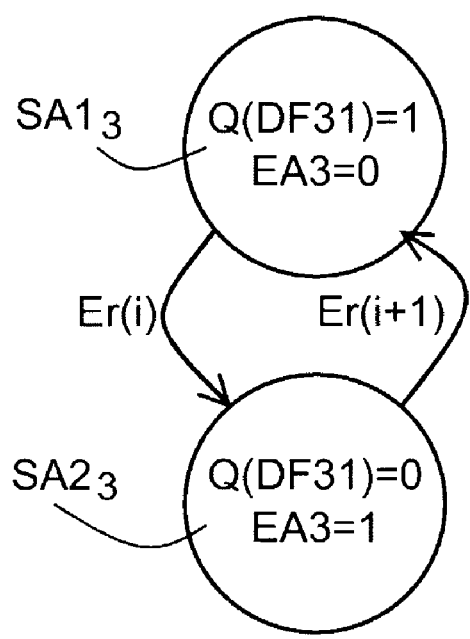
FIGS. 4A and 4B are state diagrams that illustrate the operation of the pair of two-state circuits.
Figure 4B:
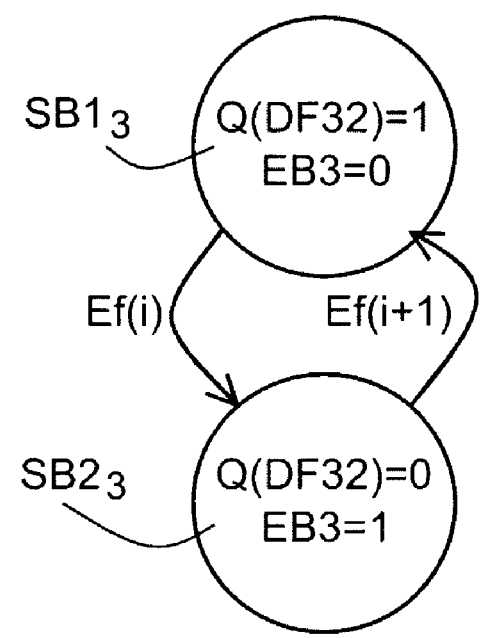

FIGS. 4A and 4B are state diagrams that illustrate the operation of multi-state circuits MSCA3 and MSCB3, respectively. FIG. 4A illustrates that multi-state circuit MSCA3 can be switched through a cycle of two states: state SA1₃ and state SA2₃. In state SA1₃, the output Q of flip-flop circuit DF31 provides a '1' and enable signal EA3 is '0'. In state SA2₃, the output Q of flip-flop circuit DF32 provides a '0' and enable signal EA3 is '1'. Let it be assumed that enable signal EB3 is '1'. In that case, multi-state circuit MSCA3 switches from state SA1₃ to state SA2₃ in response to a rising edge Er(i) in the oscillator signal. Multi-state circuit MSCA3 switches from state SA2₃ back to state SA1₃ in response to a subsequent rising edge Er(i+1).

FIG. 4B illustrates that multi-state circuit MSCB3 operates in similar fashion. Multi-state circuit MSCB3 can be switched through a cycle of two states: state SB1₃ and state SB2₃. In state SB1₃, the output Q of flip-flop circuit DF32 provides a '1' and enable signal EB3 is '0'. In state SB2₃, the output Q of flip-flop circuit DF32 provides a '0' and enable signal EB3 is '1'.

A difference is that multi-state circuit MSCB3 is responsive to falling edges in the oscillator signal, whereas multi-state circuit MSCA3 is responsive to rising edges. Let it be assumed that enable signal EA3 is '1'. In that case, multi-state circuit MSCB3 switches from state SB1₃ to state SB2₃ in response to a falling edge Ef(i). Multi-state circuit MSCB3 switches from state SB2₃ back to state SB1₃ in response to a subsequent falling edge Ef(i+1).

Figure 5:
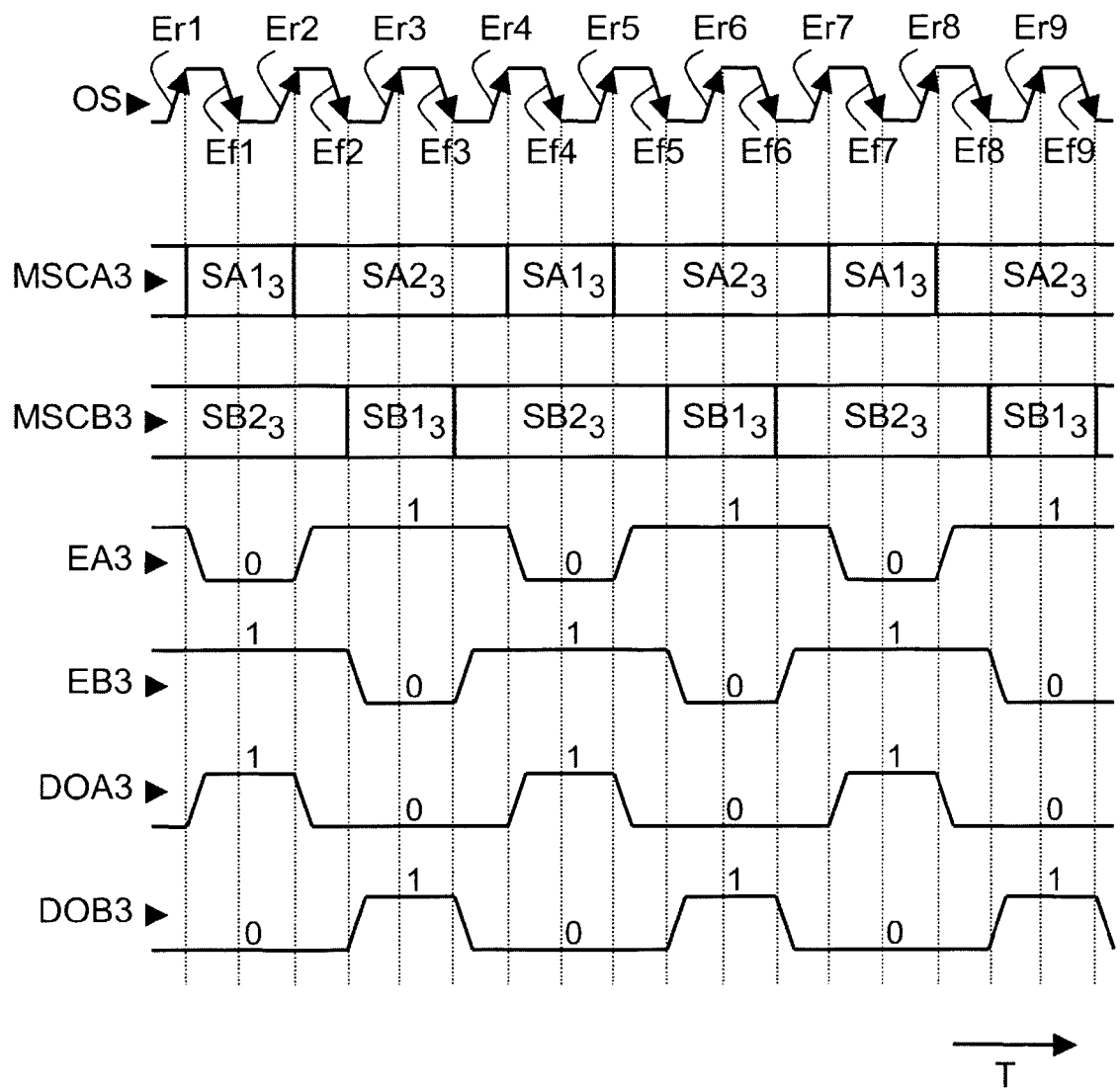
FIG. 5 is a time diagram that illustrates the operation of the pair of two-state circuits.

FIG. 5 is a timing diagram that illustrates the operation of the pair of multi-state circuits MSCA3 and MSCB3. FIG. 5 illustrates from top to bottom: the oscillator signal OS, the state of multi-state circuit MSCA3, the state of multi-state circuit MSCB3, enable signal EA3, enable signal EB3, frequency-divided signal DOA3, and frequency-divided signal DOB3. The oscillator signal OS comprises successive rising edges Er1, . . . , Er9, and successive falling edges Ef1, . . . , Ef9. At rising edge Er1, multi-state circuit MSCA3 switches to state SA1₃. In that state, enable signal EA3 is '0'. Consequently, multi-state circuit MSCB3 cannot change state when falling edge Ef1 occurs and remains in state SB2₃. At rising edge Er2, multi-state circuit MSCA3 switches from state SA1₃ to state SA2₃. In that state, enable signal EA3 is '1'. Consequently multi-state circuit MSCB3 is allowed to switch from state SB2₃ to state SB1₃ when falling edge Ef2 occurs. In state SB1₃, enable signal EB3 is '0'. Consequently, multi-state circuit MSCA3 cannot change state when rising edge Er3 occurs and remains in state SA2₃. FIG. 5 illustrates that this process continues. When multi-state circuit MSCA3 is in state SA1₃, multi-state circuit MSCB3 cannot change state because enable signal EA3 is '0' in this states. Conversely, when multi-state circuit MSCB3 is in state SB1₃, multi-state circuit MSCA3 cannot change state because enable signal EB3 is '0' in this state.

FIG. 6 illustrates a pair of multi-state circuits MSCA5, MSCB5 that provides a frequency division ratio of 5. The numeral 5 is used in the reference signs to indicate the frequency division ratio concerned. For example, numeral 5 has been added to the reference signs DOA and DOB illustrated in FIG. 2 so as to indicate that the frequency-divided signals have frequency that is 5 times lower than that of the oscillator signal OS.

Multi-state circuit MSCA5 comprises two flip-flop circuits DF51 and DF53, a nand-gate NA51, and an and-gate AN51. Multi-state circuit MSCB5 comprises two flip-flop circuits DF52 and DF54, a nand-gate NA52, an and-gate AN52, and an inverter INV5. The flip-flop circuits DF are similar to those in FIG. 3. Inverter INV5 converts a falling edge in the oscillator signal OS into a rising edge.

And-gates AN51, AN52 can be considered to operate as switches under the control of enable signals EB5, EA5, respectively. Flip-flop circuits DF51 and DF53 receive the oscillator signal OS when enable signal EB5 is '1'. Accordingly, flip-flop circuits DF51 and DF53 will be responsive to a rising edge in the oscillator signal OS. In contradistinction, flip-flop circuits DF51 and DF53 will not be responsive to the oscillator signal OS when enable signal EB5 is '0'. Likewise, flip-flop circuits DF52 and DF54 receive the oscillator signal OS when enable signal EA5 is '1'. Accordingly, flip-flop circuits DF52 and DF54 will be responsive to a falling edge in the oscillator signal OS because of inverter INV5. Flip-flop circuits DF52 and DF54 will not be responsive to the oscillator signal OS when enable signal EB5 is '0'.

Figure 7A:
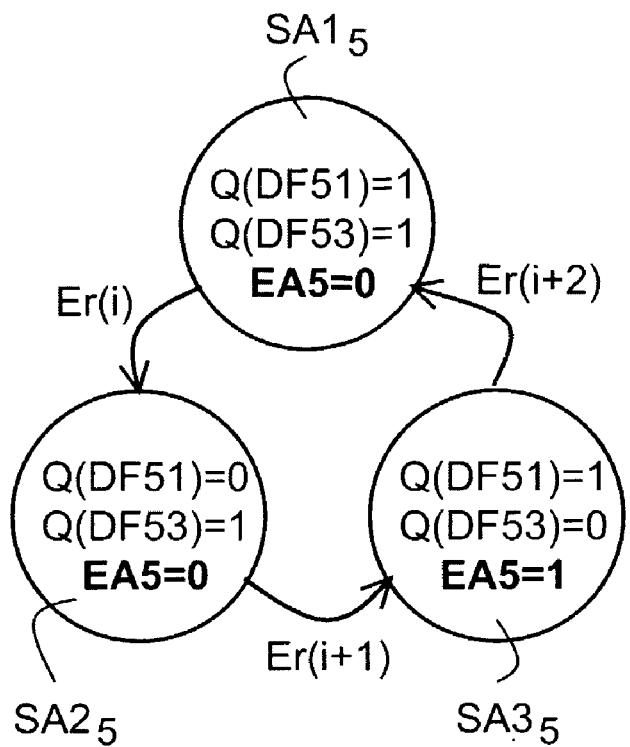
FIGS. 7A and 7B are state diagrams that illustrate the operation of the pair of three-state circuits.
Figure 7B:
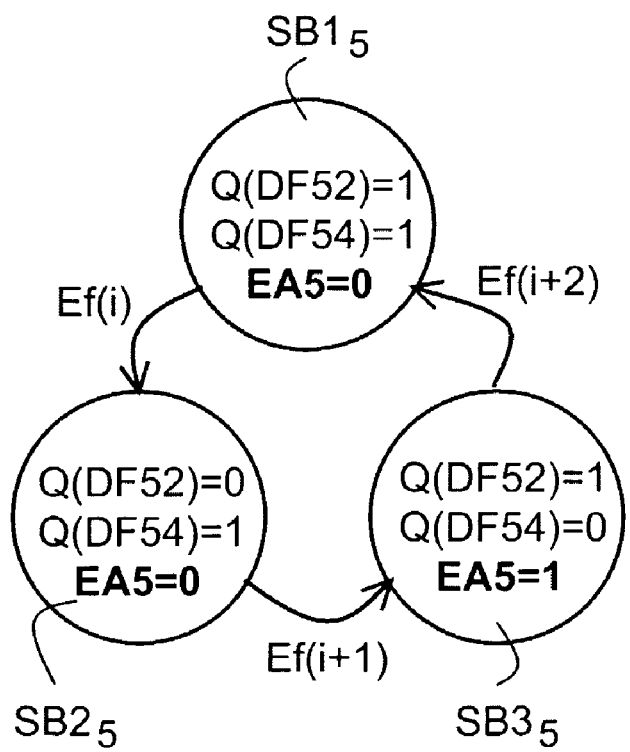

FIGS. 7A and 7B are state diagrams that illustrate the operation of multi-state circuits MSCA5 and MSCB5, respectively. FIG. 7A illustrates that multi-state circuit MSCA5 can be switched through a cycle of three states: state SA1₅, state SA2₅ and state SA3₅. In state SA1₅, the respective outputs Q of flip-flop circuits DF51 and DF53 provide a '1'. Enable signal EA5 is '0'. In state SA2₅, the output Q of flip-flop circuit DF51 provides a '0' whereas the output Q of flip-flop circuit DF53 provides a '1'. The enable signal EA5 is still '0'. In state SA3₅, the output Q of flip-flop circuit DF51 provides a '1' whereas the output Q of flip-flop circuit DF53 provides a '0'. The enable signal EA5 is now '1'. Let it be assumed that enable signal EB5 is '1'. In that case, multi-state circuit MSCA5 switches from state SA1₅ to state SA2₅ in response to a rising edge Er(i) in the oscillator signal. Multi-state circuit MSCA5 switches from state SA2₅ to state SA3₅ in response to a subsequent rising edge Er(i+1). Multi-state circuit MSCA5 switches from state SA3₅ back to state SA1₅ in response to a further subsequent rising edge Er(i+2).

FIG. 7B illustrates that multi-state circuit MSCB5 operates in similar fashion. Multi-state circuit MSCB5 can be switched through a cycle of three states: state SB1₅, state SB2₅ and state SB3₅; In state SB1₅, the respective outputs Q of flip-flop circuits DF52 and DF54 provide a '1'. Enable signal EB5 is '0'. In state SB2₅, the output Q of flip-flop circuit DF52 provides a '0' whereas the output Q of flip-flop circuit DF54 provides a '1'. The enable signal EB5 is still '0'. In state SB3₅, the output Q of flip-flop circuit DF52 provides a '1' whereas the output Q of flip-flop circuit DF54 provides a '0'. The enable signal EB5 is now '1'.

A difference is that multi-state circuit MSCB7 is responsive to falling edges in the oscillator signal, whereas multi-state circuit MSCA7 is responsive to rising edges. Let it be assumed that enable signal EA5 is '1'. In that case, multi-state circuit MSCB5 switches from state SB1₅ to state SB2₅ in response to a falling edge Ef(i). Multi-state circuit MSCB5 switches from state SB2₅ to state SB3₅ in response to a subsequent falling edge Ef(i+1). Multi-state circuit MSCB5 switches from state SB3₅ back to state SB1₅ in response to a further subsequent falling edge Ef(i+2).

Figure 8:
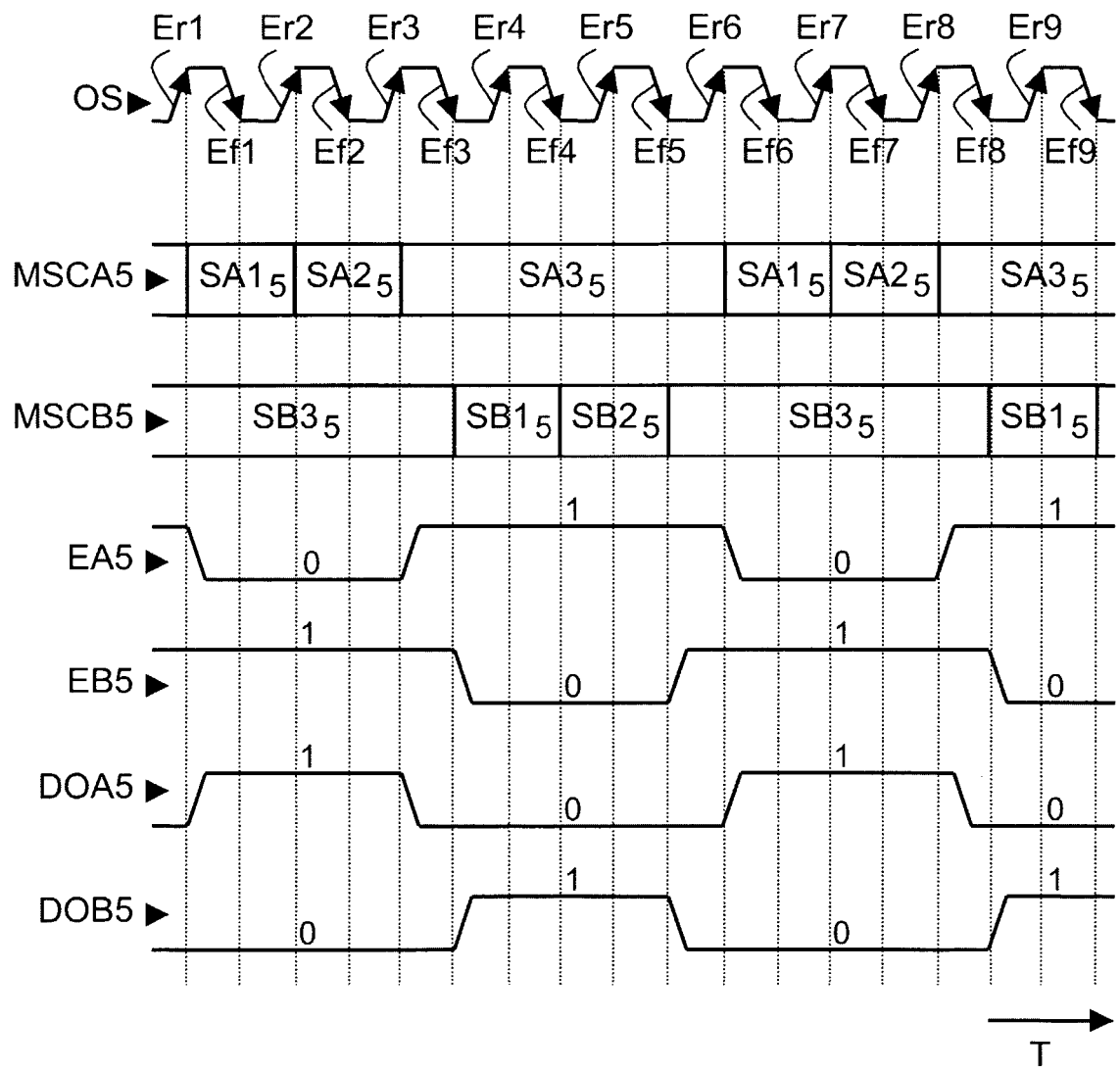
FIG. 8 is a time diagram that illustrates the operation of the pair of three-state circuits.

FIG. 8 is a timing diagram that illustrates the operation of the pair of multi-state circuits MSCA5 and MSCB5. FIG. 8 illustrates from top to bottom: the oscillator signal OS, the state of multi-state circuit MSCA5, the state of multi-state circuit MSCB5, enable signal EA5, enable signal EB5, frequency-divided signal DOA5, and frequency-divided signal DOB5. The oscillator signal OS comprises successive rising edges Er1, . . . , Er9, and successive falling edges Ef1, . . . , Ef9. At rising edge Er1, multi-state circuit MSCA5 switches to state SA1₅. In that state, enable signal EA5 is '0'. Consequently, multi-state circuit MSCB5 cannot change state when falling edge Ef1 occurs and remains in state SB3₅. At rising edge Er2, multi-state circuit MSCA5 switches from state SA1₅ to state SA2₅. In that state, enable signal EA5 is still '0'. Consequently, multi-state circuit MSCB5 can still not change state when falling edge Ef2 occurs and still remains in state SB3₅.

At rising edge Er3, multi-state circuit MSCA5 switches from state SA2₅ to state SA3₅. In that state, enable signal EA5 is '1'. Consequently, multi-state circuit MSCB5 is now allowed to switch from state SB3₅ to state SB1₅ when falling edge Ef3 occurs. In state SB1₅, enable signal EB5 is '0'. Consequently, multi-state circuit MSCA5 cannot change state when rising edge Er4 occurs and remains in state SA3₅. At falling edge Ef4, multi-state circuit MSCB5 switches from state SB1₅ to state SB2₅. In that state, enable signal EB5 is still '0'. Consequently, multi-state circuit MSCA5 can still not change state when rising edge Er5 occurs and still remains in state SB3₅. At falling edge Ef5, multi-state circuit MSCB5 switches from state SB2₅ to state SB3₅. In that state, enable signal EB5 is '1'. Consequently, multi-state circuit MSCA5 is now allowed to switch from state SA3₅ to state SA1₅ when rising edge Er6 occurs. FIG. 8 illustrates that this process continues. When multi-state circuit MSCA5 is in state SA1₅ or SA2₅, multi-state circuit MSCB5 cannot change state because enable signal EA5 is '0' in these states. Conversely, when multi-state circuit MSCB5 is in state SB1₅ or SB2₅, multi-state circuit MSCA5 cannot change state because enable signal EB5 is '0' in these states.

FIG. 9 illustrates a pair of multi-state circuits MSCA7, MSCB7 that provides a frequency division ratio of 7. The numeral 7 is used in the reference signs to indicate the frequency division ratio concerned. For example, numeral 7 has been added to the reference signs DOA and DOB illustrated in FIG. 2 so as to indicate that the frequency-divided signals have frequency that is 7 times lower than that of the oscillator signal OS.

Multi-state circuit MSCA7 comprises two flip-flop circuits DF71 and DF73, two and-gates AN71 and AN73. Multi-state circuit MSCB7 comprises two flip-flop circuits DF72 and DF74, two and-gates AN72 and AN74 and an inverter INV7. The flip-flop circuits DF are similar to those in FIG. 3. Inverter INV7 converts a falling edge in the oscillator signal OS into a rising edge.

And-gates AN71, AN72 can be considered to operate as switches under the control of enable signals EB7, EA7, respectively. Flip-flop circuits DF71 and DF73 receive the oscillator signal OS when enable signal EB7 is '1'. Accordingly, flip-flop circuits DF71 and DF73 will be responsive to a rising edge in the oscillator signal OS. In contradistinction, flip-flop circuits DF71 and DF73 will not be responsive to the oscillator signal OS when enable signal EB7 is '0'. Likewise, flip-flop circuits DF72 and DF74 receive the oscillator signal OS when enable signal EA7 is '1'. Accordingly, flip-flop circuits DF72 and DF74 will be responsive to a falling edge in the oscillator signal OS because of inverter INV7. Flip-flop circuits DF72 and DF74 will not be responsive to the oscillator signal OS when enable signal EB7 is '0'.

Figure 10A:
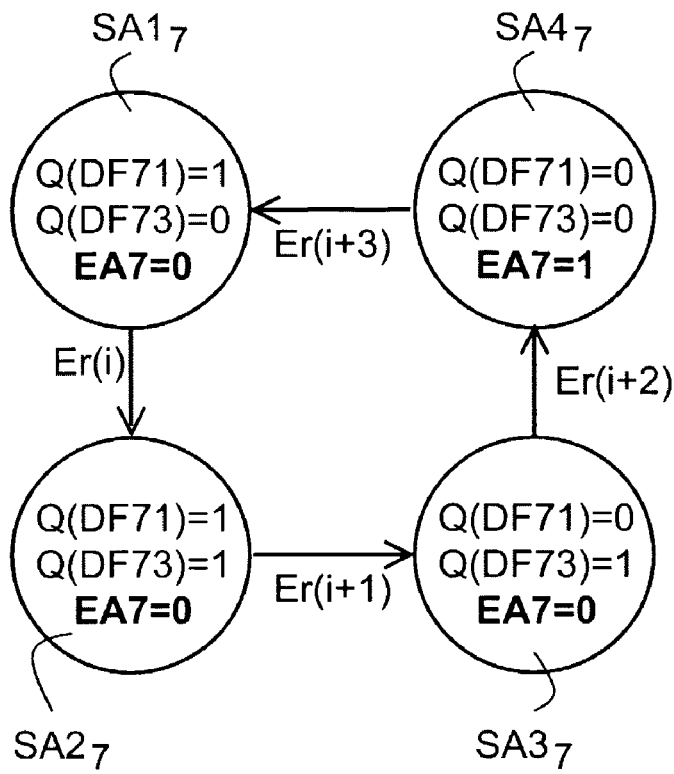
FIGS. 10A and 10B are state diagram that illustrate the operation of the pair of four-state circuits.
Figure 10B:
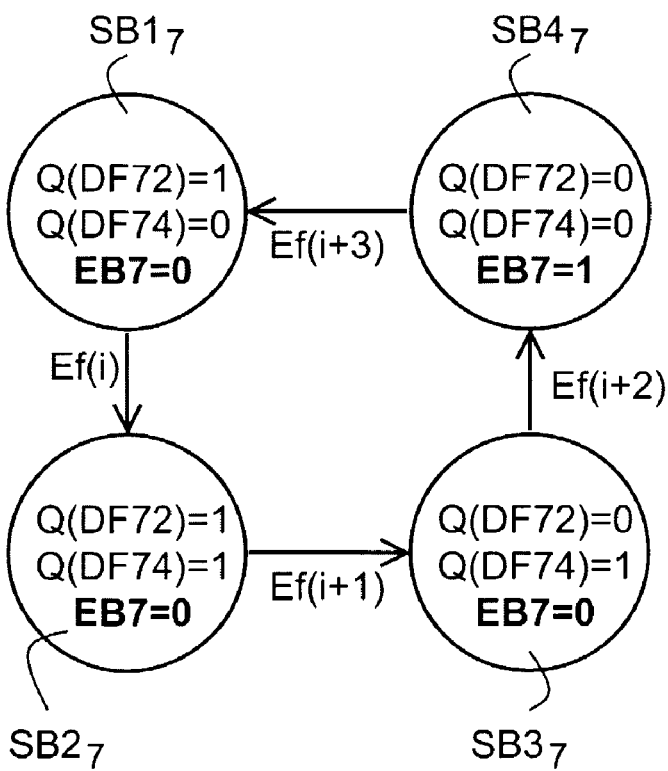

FIGS. 10A and 10B are state diagrams that illustrate the operation of multi-state circuits MSCA7 and MSCB7, respectively. FIG. 10A illustrates that multi-state circuit MSCA7 can be switched through a cycle of four states: state SA1₇, state SA2₇, state SA3₇ and state SA4₇. In state SA1₇, the output Q of flip-flop circuit DF71 provides a '1' whereas the output Q of flip-flop circuit DF73 provides a '0'. Enable signal EA7 is '0'. In state SA2₇, the respective outputs Q of flip-flop circuits DF71 and DF73 provide a '1'. Enable signal EA7 is still '0'. In state SA3₇, the output Q of flip-flop circuit DF71 provides a '0' whereas the output Q of flip-flop circuit DF73 provides a '1'. The enable signal EA7 is still '0'. In state SA4₇, the respective outputs Q of flip-flop circuits DF71 and DF73 provide a '0'. The enable signal EA7 is now '1'. Let it be assumed that enable signal EB7 is '1'. In that case, multi-state circuit MSCA7 switches from state SA1₇ to SA2₇, then to SA3₇, and then to SA4₇ in response to a series of rising edges Er(i), Er(i+1), Er(i+2), and Er(i+3), respectively, in the oscillator signal.

FIG. 10B illustrates that multi-state circuit MSCB7 operates in similar fashion. Multi-state circuit MSCB7 can be switched through a cycle of four states: state SB1₇, state SB2₇, state SB3₇ and state SB4₇. In state SB1₇, the output Q of flip-flop circuit DF71 provides a '1' whereas the output Q of flip-flop circuit DF73 provides a '0'. Enable signal EB7 is '0'. In state SB2₇, the respective outputs Q of flip-flop circuits DF71 and DF73 provide a '1'. Enable signal EB7 is still '0'. In state SB3₇, the output Q of flip-flop circuit DF71 provides a '0' whereas the output Q of flip-flop circuit DF73 provides a '1'. The enable signal EB7 is still '0'. In state SB4₇, the respective outputs Q of flip-flop circuits DF71 and DF73 provide a '0'. The enable signal EB7 is now '1'.

A difference is that multi-state circuit MSCB7 is responsive to falling edges in the oscillator signal, whereas multi-state circuit MSCA7 is responsive to rising edges. Let it be assumed that enable signal EA7 is '1'. In that case, multi-state circuit MSCA7 switches from state SB1₇ to SB2₇, then to SB3₇, and then to SB4₇ in response to a series of falling edges Ef(i), Ef(i+1), Ef(i+2), and Ef(i+3), respectively, in the oscillator signal.

Figure 11:
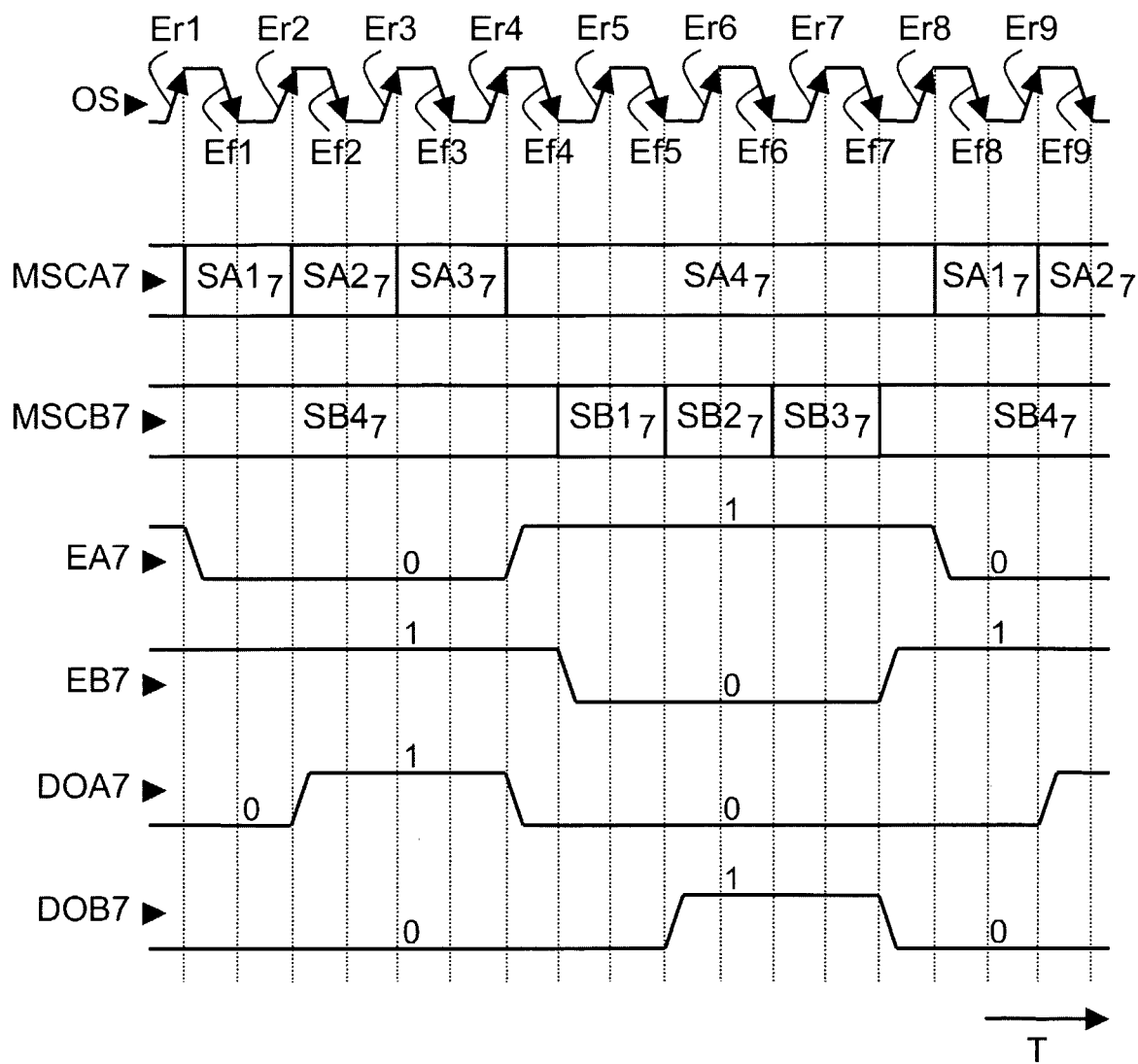
FIG. 11 is a time diagram that illustrates the operation of the pair of four-state circuits.

FIG. 11 is a timing diagram that illustrates the operation of the pair of multi-state circuits MSCA7 and MSCB7. FIG. 11 illustrates from top to bottom: the oscillator signal OS, the state of multi-state circuit MSCA7, the state of multi-state circuit MSCB7, enable signal EA7, enable signal EB7, frequency-divided signal DOA7, and frequency-divided signal DOB7. The oscillator signal OS comprises successive rising edges Er1, . . . , Er9, and successive falling edges Ef1, . . . , Ef9. At rising edge Er1, multi-state circuit MSCA7 switches to state SA1₇. In that state, enable signal EA7 is '0'. Consequently, multi-state circuit MSCB7 cannot change state when falling edge Ef1 occurs and remains in state SB4₇. At rising edge Er2, multi-state circuit MSCA7 switches from state SA1₇ to state SA2₇. In that state, enable signal EA7 is still '0'. Consequently, multi-state circuit MSCB7 can still not change state when falling edge Ef2 occurs and still remains in state SB4₇. At rising edge Er3, multi-state circuit MSCA7 switches from state SA2₇ to state SA3₇. In that state, enable signal EA7 is still '0'. Consequently, multi-state circuit MSCB7 can still not change state when falling edge Ef3 occurs and still remains in state SB4₇.

At rising edge Er4, multi-state circuit MSCA7 switches from state SA3₇ to state SA4₇. In that state, enable signal EA7 is '1'. Consequently, multi-state circuit MSCB7 is now allowed to switch from state SB4₇ to state SB1₇ when falling edge Ef4 occurs. In state SB1₇, enable signal EB7 is '0'. Consequently, multi-state circuit MSCA7 cannot change state when rising edge Er5 occurs and remains in state SA4₇. At falling edge Er5, multi-state circuit MSCB7 switches from state SB1₇ to state SB2₇. In that state, enable signal EB7 is still '0'. Consequently, multi-state circuit MSCA7 can still not change state when rising edge Er6 occurs and still remains in state SB4₇. At falling edge Ef6, multi-state circuit MSCB7 switches from state SB2₇ to state SB3₇. In that state, enable signal EB7 is still '0'. Consequently, multi-state circuit MSCA7 can still not change state when falling edge Ef6 occurs and still remains in state SB4₇. At falling edge Ef7, multi-state circuit MSCB7 switches from state SB3₇ to state SB4₇. In that state, enable signal EB7 is '1'. Consequently, multi-state circuit MSCA7 is now allowed to switch from state SA3₇ to state SA1₇ when rising edge Er8 occurs. FIG. 8 illustrates that this process continues. When multi-state circuit MSCA7 is in state SA1₇, SA2₇, or SA3₇ multi-state circuit MSCB7 cannot change state because enable signal EA7 is '0' in these states. Conversely, when multi-state circuit MSCB7 is in state SB1₇, SB2₇, or SB3₇ multi-state circuit MSCA7 cannot change state because enable signal EB7 is '0' in these states.

Figure 12:
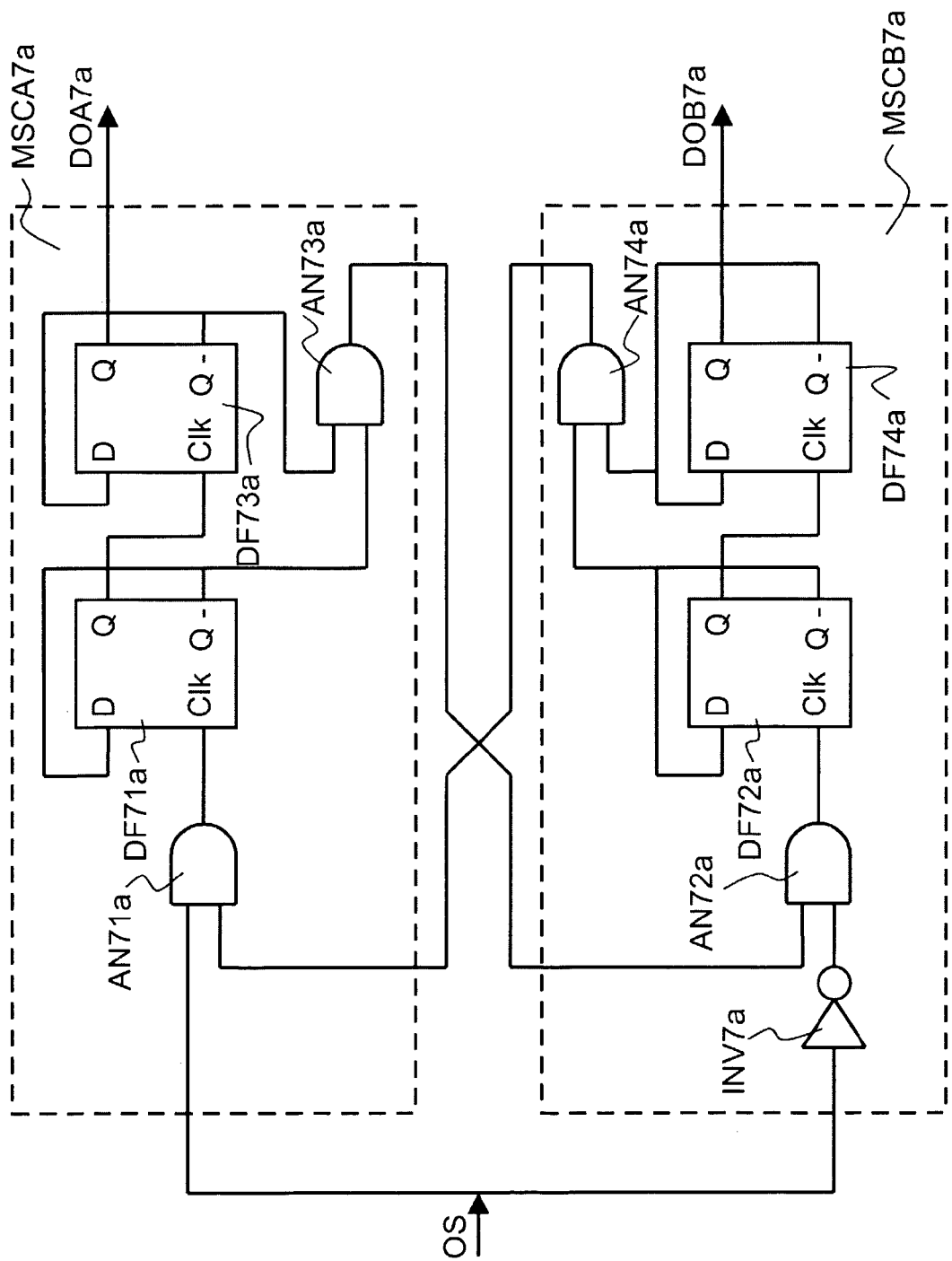
FIG. 12 is a circuit diagram that illustrates an alternative pair of four-state circuits for the frequency conversion circuit.

FIG. 12 illustrates an alternative pair of multi-state circuits MSCA7a, MSCB7b that provides a frequency division ratio of 7. The alternative pair of multi-state circuits comprises the same elements as the pair of multi-state circuits MSCA7, MSCB7 illustrated in FIG. 9. Corresponding elements have similar reference signs, the letter "a" being added to the reference sign of each element in FIG. 12.

There is a difference in the manner in which elements are coupled. In the alternative pair of multi-state circuits illustrated in FIG. 12, the clock input Clk of flip-flop circuit DF53a is coupled to the output Q of flip-flop circuit DF51a, whereas in the pair of multi-state circuits MSCA, MSCB illustrated in FIG. 9 the clock input Clk of flip-flop circuit DF53 receives the oscillator signal OS via and-gate AN51. In the alternative pair of multi-state circuits illustrated in FIG. 12, the data input D of each flip-flop circuit is coupled to the inverted output Q– of the flip-flop circuit. In contradistinction, in the pair of multi-state circuits MSCA7, MSCB7 illustrated in FIG. 9, the data input D of flip-flop circuits DF71 and DF72 are coupled to the inverted output Q– of flip-flop circuit DF73 and DF74, respectively. The data input D of flip-flop circuits DF73 and DF74 coupled to the output Q of flip-flop circuit DF71 and DF72, respectively.

The alternative pair of multi-state circuits illustrated in FIG. 12 is functionally equivalent to the pair of multi-state circuits MSCA, MSCB illustrated in FIG. 9. The embodiment illustrated in FIG. 9 can be regarded as a synchronous implementation, whereas the embodiment illustrated in FIG. 12 can be regarded as an asynchronous implementation.

Figure 13:
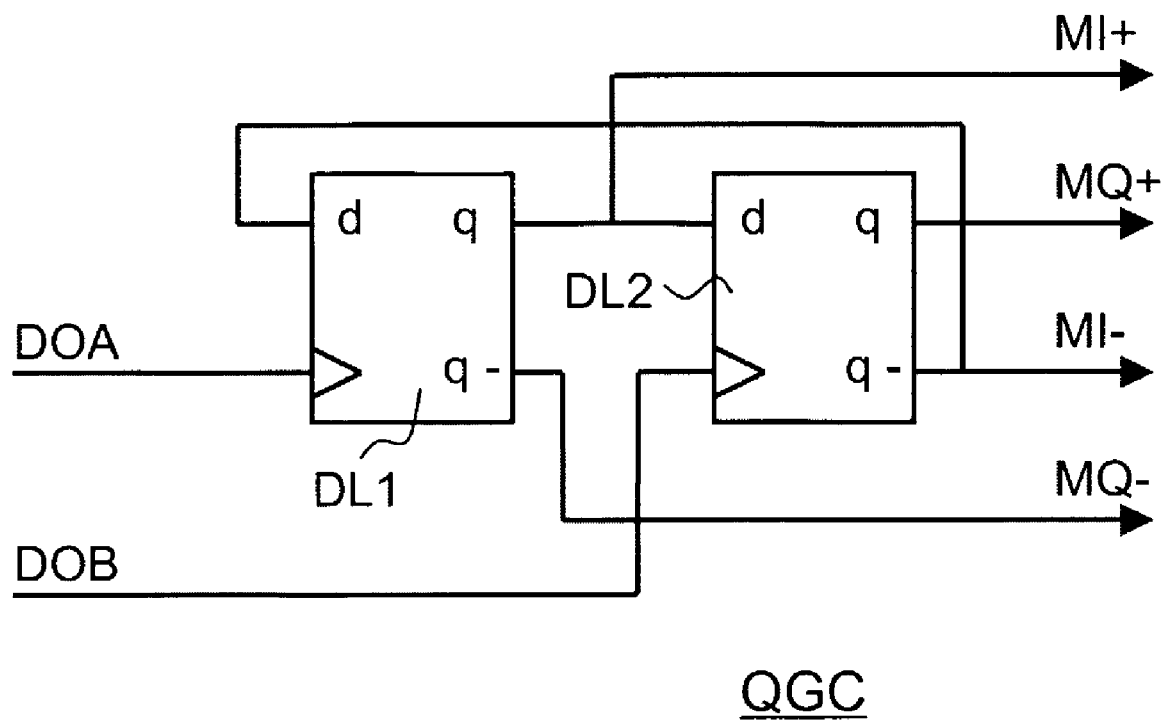
FIG. 13 is a circuit diagram that illustrates a quadrature generation circuit for the frequency conversion circuit.

FIG. 13 illustrates the quadrature generation circuit QGC, which forms part of the frequency conversion circuit FCV illustrated in FIG. 2. The quadrature generation circuit QGC comprises two latch circuits DL1 and DL2 of the "d"-type. Each latch circuit DL has a data input d, and output q, an inverted output q–, and a clock input represented by a triangle. The data input d of latch circuit DL1 is coupled to the inverted output q– of latch circuit DL2. The data input d of latch circuit DL2 is coupled to the output q of latch circuit DL1. Latch circuit DL1 receives the frequency-divided signal DOA at its clock input. Latch circuit DL1 receives the other frequency-divided signal DOB at its clock input. It should be noted that in the embodiments described hereinbefore with respect to FIGS. 3-11, the frequency-divided signals DOA and DOB are 180° phase shifted with respect to each other.

The respective outputs q of latch circuits DL1 and DL2 provide quadrature mixer signals MI+ and MQ+, respectively. The respective inverted outputs q– of latch circuits DL1 and DL2 provide quadrature mixer signals MQ– and MI–, respectively. The quadrature mixer signals have a frequency that is half the frequency of the frequency-divided signals DOA and DOB that the multi-state circuits provide. That is, the quadrature generation circuit QGC provides a frequency division by two.

Figure 14:
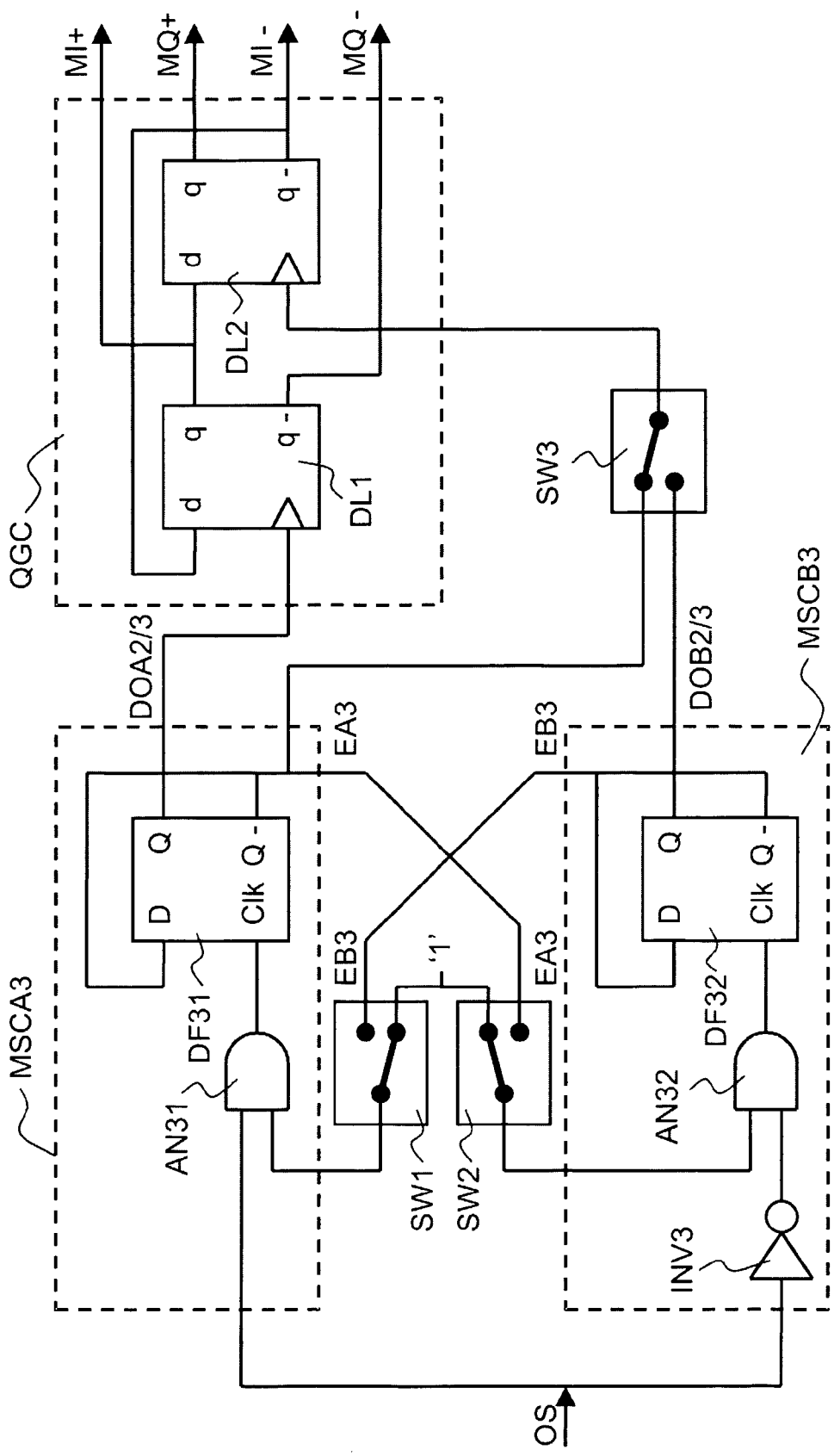
FIG. 14 illustrates a combination of the pair of two-state circuits and the quadrature generation circuit.

FIG. 14 illustrates a combination of the pair of multi-state circuits MSCA, MSCB illustrated in FIG. 3 and the quadrature generation circuit QGC illustrated in FIG. 13. The combination comprises three switches SW1, SW2, and SW3. Each switch has two positions: the position as shown in FIG. 14 and an opposite position.

Let it be assumed that each switch is in the position as illustrated in FIG. 14. In that case, multi-state circuit MSCA provides a frequency division by two: the frequency of frequency-divided signal DOA2/3 is half the frequency of the oscillator signal OS. The frequency of the quadrature mixer signals MI+, MQ+, MI–, MQ– will be one quarter of the frequency of the oscillator signal OS. Let it now be assumed that each switch is in the opposite position. In that case, the multi-state circuit MSCA provides a frequency division by three: the frequency of frequency-divided signal DOA2/3 is one-third the frequency of the oscillator signal OS. The frequency of the quadrature mixer signals MI+, MQ+, MI–, MQ– will be one sixth of the frequency of the oscillator signal OS. Consequently, the combination illustrated in FIG. 14 can provide different frequency division ratios with relatively few additional elements.

Figure 15:
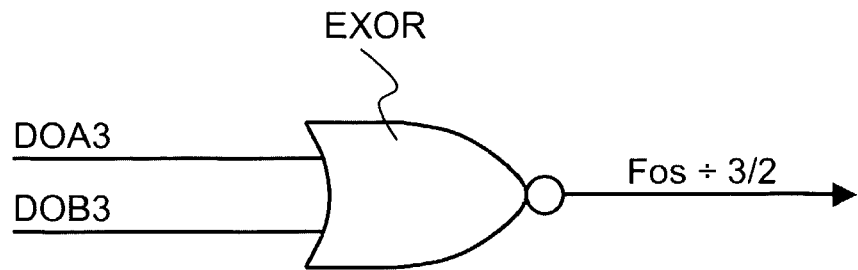
FIG. 15 illustrates an output circuit for the pair of multi-state circuits.

FIG. 15 illustrates an output circuit that can be combined with the pair of multi-state circuits MSCA, MSCB illustrated in FIG. 3. The output circuit comprises an exor-gate EXOR. One input of the exor-gate EXOR receives frequency-divided signal DOA3, another input receives frequency-divided signal DOA3. An output of the exor-gate EXOR provides a signal whose frequency is two-third of the frequency of the oscillator signal OS. That is, the combination of the output circuit illustrated in FIG. 15 and the pair of multi-state circuits MSCA, MSCB illustrated in FIG. 3, provide a frequency division by 1.5.

Figure 16:
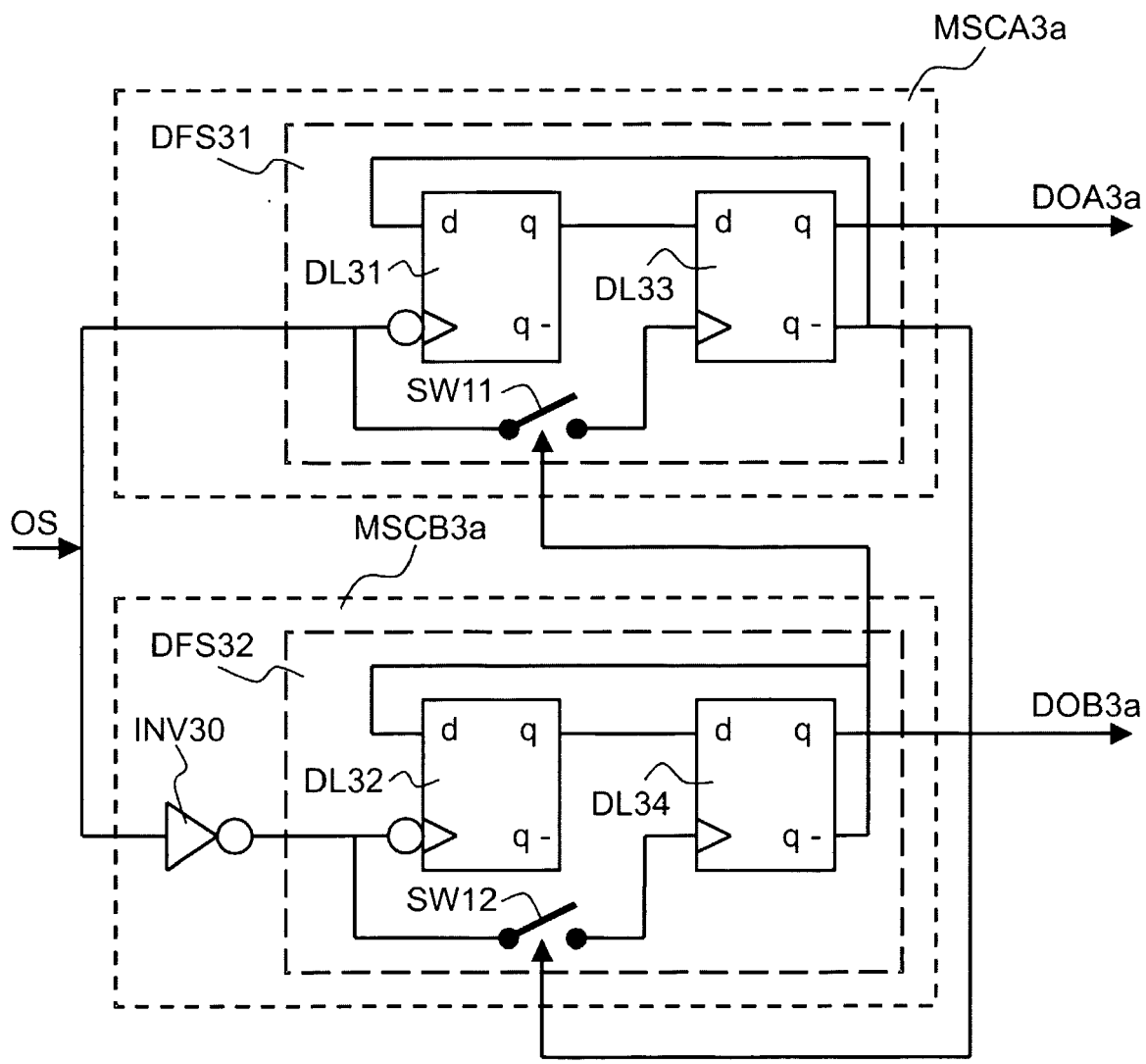
FIG. 16 illustrates a pair of two-state circuits with embedded switches.

FIG. 16 illustrates a pair of multi-state circuits MSCA3a, MSCB3a that is functionally equivalent to the pair of multi-state circuits MSCA3, MSCB3 illustrated in FIG. 3. Multi-state circuit MSCA comprises a switched flip-flop circuit DFS31. Multi-state circuit MSC comprises a switched flip-flop circuit DFS32 and an inverter INV30. Flip-flop circuit DFS31 comprises two latch circuits of the "d" type DL31 and DL33 and a switch SW11. Flip-flop circuit DFS32 is similar: it comprises two latch circuits of the "d" type DL32 and DL34 and a switch SW12. Each latch circuit DL has a data input d, and output q, an inverted output q–, and a clock input, which is represented as a triangle. Latch circuits DL33 and DL34 are locked when the respective clock inputs receive a signal level that is '0', whereas latch circuits DL31 and DL32 are locked when the respective clock inputs receive a signal level that is '1'. This difference is symbolized by a circle in front of the respective clock inputs of latch circuits DL31 and DL32.

The switches SW11 and SW12 are functionally equivalent to and-gates AN31 and AN32, respectively, illustrated in FIG. 3. Each switch can be switched between an open position and a closed position. Latch circuits DL33 and DL34 are responsive to the oscillator signal OS when switches SW11 and SW12, respectively, are in a closed position. Latch circuit DL33 is unlocked when the oscillator signal OS has a level that is '1'. Latch circuit DL34 is unlocked when the oscillator signal OS has a level that is '0'. In contradistinction, latch circuits DL33 and DL34 are always locked when switches SW11 and SW12, respectively, are in the open position. Latch circuits DL33 and DL34 are no longer responsive to the oscillator signal OS. The inverted output q– of latch circuit DL34 controls switch SW11. Switch SW11 is in the open position when the inverted output q– provides a '0' whereas it is in the closed position when the inverted output q– provides a '1'. The inverted output q– of latch circuit DL33 controls switch SW12 in a similar fashion.

The embodiment illustrated in FIG. 16 allows even lower power consumption at comparable frequencies than the embodiment illustrated in FIG. 3. This advantage is due to the fact that the enabling or disabling of a state change, has been embedded within the flip-flop circuits that constitute the multi-state circuits. This embedding reduces delay.

Figure 17:
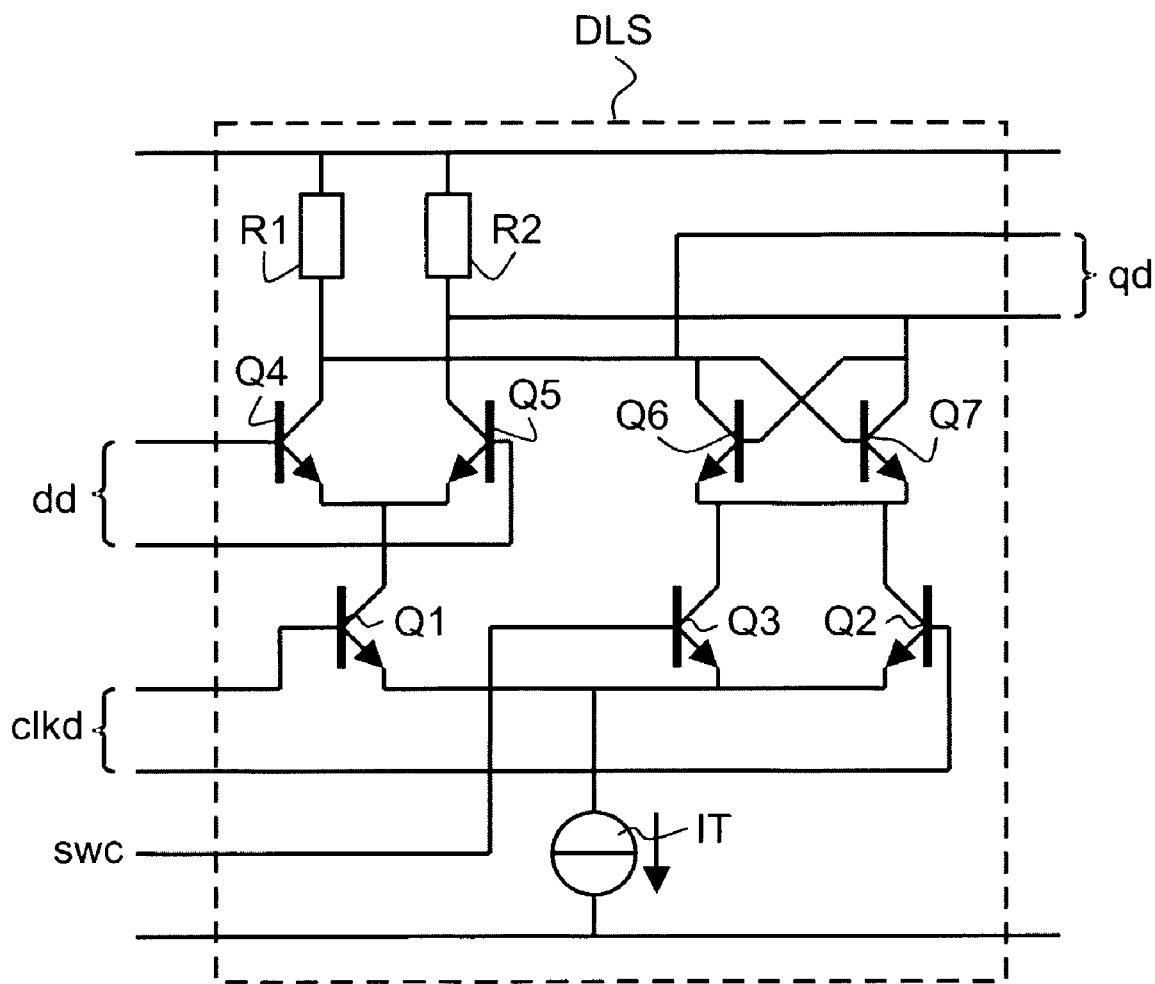
FIG. 17 illustrates a switchable latch circuit.

FIG. 17 illustrates a transistor implementation of a switched latch circuit DLS. The switched latch circuit DLS is functionally equivalent to the combination of switch SW11 and latch circuit DL33 illustrated in FIG. 16. The switched latch circuit DLS has a differential data input dd, a differential output qd, a differential clock input clkd, and a switch control input swc. The switched latch circuit DLS comprises various transistors Q1, . . . , Q7, a current source IT and two resistors R1, R2. In one state, transistor Q6 is conducting whereas transistor Q7 is non-conducting. In another state, transistor Q7 is conducting whereas transistor Q6 is non-conducting.

The current source IT provides a tail current that is divided among transistors Q1, Q2, and Q3. The tail current will substantially not flow through transistor Q3 when the voltage at the base of this transistor is sufficiently low. The tail current will either flow through transistor Q1 or transistor Q2, or both, depending on the signal received at the differential clock input clkd. In this case, the switched latch circuit DLS is allowed to change state. However, the switched latch circuit DLS is prevented from changing state when the voltage at the base of transistor Q3 is sufficiently high so that the tail current substantially flows through this transistor. In this case, the tail current will substantially not flow through transistor Q1; transistor Q1 is dry as it were. The result is that the differential pair formed by transistors Q4 and Q5 is switched off. This prevents a signal that is present on the differential data input dd from having any effect on the switched latch circuit DLS. The switched latch circuit DLS is locked in its current state.

The pair of multi-state circuits MSCA3a, MSCB3b illustrated in FIG. 16 can be implemented on the basis of the switched latch circuit DLS illustrated in FIG. 17. The combination of switch SW11 and latch circuit DL33 can be implemented in the form of the switched latch circuit DLS illustrated in FIG. 17. An inverting circuit should be added so that the voltage at the switch control input swc is high when the inverted output q- of latch circuit DL34 is '0' and vice versa. In a similar manner, the combination of switch SW12 and latch circuit DL34 can be implemented in the form of the switched latch circuit DLS illustrated in FIG. 17. Latch circuits DL31 and DL32 in FIG. 16 can also be implemented in the form of the switched latch circuit DLS illustrated in FIG. 17. However, transistor Q3 may be left out. Further circuits may be used to modify the DC component of a signal. Such circuits are commonly referred to as level-shift circuits. For example, one or more level-shift circuits may be used to ensure that the signal applied at the differential clock input clkd illustrated in FIG. 17 has an appropriate DC level with respect to the signal applied at the switch control input swc. The signal applied at the differential clock input clkd will be derived from the oscillator signal OS illustrated in FIG. 16. The signal applied at a switch control input will be derived from the inverted output q of latch circuit DL33 or DL34 illustrated in FIG. 16.

It is advantageous that signals and circuits are in a differential form. In this manner, it is relatively easy to invert a signal. A differential signal has two components. It is sufficient to replace one component by the other component and vice versa, in order to obtain an inverted version of the differential signal. This is just a matter of wiring; no circuitry is required. For example, inverter INV31 illustrated in FIG. 16 need not be a circuit if the oscillator signal OS is in the differential form. The same applies to the inverters shown in the other embodiments.

The detailed description hereinbefore with reference to the drawings illustrates the following characteristics. A frequency-division circuit comprises a pair of multi-state circuits (MSCA, MSCB). Each multi-state circuit (MSCA, MSCB) can be switched throughout a cycle of states (SA(1), . . . , SA(N); SB(1), . . . , SB(N)). One multi-state circuit (MSCA) switches to a next state in response to a rising edge (Er) in an input signal (oscillator signal OS). The other multi-state circuit (MSCB) switches to a next state in response to a falling edge (Ef) in the input signal (OS). Each multi-state circuit (MSCA, MSCB) has at least one state (SA(1), SB(1)) in which the multi-state circuit inhibits the other multi-state circuit (MSCB, MSCA) so as to prevent the other multi-state circuit (MSCB, MSCA) from switching to the next state.

The detailed description hereinbefore further illustrates the following optional characteristics.

The frequency-division circuit comprises an output circuit (the quadrature generation circuit QGC illustrated in FIG. 13 or the exor-gate illustrated in FIG. 15). The output circuit receives an output signal (frequency-divided signals DOA, DOB) from each multi-state circuit (MSCA, MSCB). The output circuit derives a processed output signal (quadrature mixer signals MI+, MQ+, MI−, MQ−, or signal Fos÷3/2 ) from respective output signals of the multi-state circuits. An advantage of these characteristics is that it is possible to generate a great variety of output signals.

The output circuit (in the form of the quadrature generation circuit QGC illustrated in FIG. 13) comprises a first and a second latch circuit (DL1, DL2). Each latch circuit (DL1, DL2) has a data input (d), a clock input (>), an output (q), and an inverted output (q−). The clock input (>) of the first latch circuit (DL1) receives an output signal (DOA) of one multi-state circuit (MSCA). The clock input (>) of the second latch circuit (DL2) receives an output signal (DOB) of the other multi-state circuit (MSCB). The data input (d) of the first latch circuit (DL1) is coupled to the inverted output (q−) of the second latch circuit (DL2). The data input (d) of the second latch circuit (DL2) is coupled to the output (d) of the first latch circuit (DL1). An advantage of these characteristics is that it is possible to generate a set of quadrature signals. Such signals allow good image suppression when applied to a quadrature mixer circuit.

The output circuit (in the form of exor-gate EXOR illustrated in FIG. 15) comprises a logic-gate circuit (the exor-gate EXOR). An advantage of this characteristic is that it is possible to obtain a non-integer division ratio.

Each multi-state circuit comprises a switchable latch circuit (DLS illustrated in FIG. 17) having a switch control input (the input swc). The switchable latch circuit (DLS) does not change state when an inhibit signal is present at the switch control input (In FIG. 17, the inhibit signal corresponds to a signal that causes the tail current to substantially flow through transistor Q3). An advantage of these characteristics is that it is possible to achieve even lower power consumption or operation at even higher frequencies, or both.

Each multi-state circuit comprises differential pairs (Q1-Q2, Q4-Q5 illustrated in FIG. 17) that receive and provide differential signals (differential input signals dd, clkd and a differential output signal at qd). An advantage of these characteristics is that inversion of a signal requires few circuitries only or even none at all.

The aforementioned characteristics can be implemented in numerous different manners. In order to illustrate this, some alternatives are briefly indicated. The cycle of states throughout which one multi-state state circuit is switched, may be different from the cycle of states throughout which the other multi-state circuit is switched. Perfect symmetry is not required. Accordingly, it is possible to generate phase relationships between respective output signals of the multi-state circuit that are different from the examples given in the description. The multi-state circuit may comprise any type of flip-flop circuit. For example, JK flip-flop circuits can be used to implement a multi-state circuit. There are numerous different output circuits that can be combined with the pair of multi-state circuits. For example, an output circuit may comprise gates other than an exor-gate.

Functions may be implemented by means of items of hardware or software, or both. In this respect, the drawings are diagrammatic, each representing only one possible embodiment of the invention. Thus, although a drawing shows different functions as different blocks, this by no means excludes that a single item of hardware or software carries out several functions. Nor does it exclude that an assembly of items of hardware or software or both carry out a function.

The remarks made herein before demonstrate that the detailed description with reference to the drawings, illustrate rather than limit the invention. There are numerous alternatives, which fall within the scope of the appended claims. Any reference sign in a claim should not be construed as limiting the claim. The word "comprising" does not exclude the presence of other elements or steps than those listed in a claim. The word "a" or "an" preceding an element or step does not exclude the presence of a plurality of such elements or steps.

The invention claimed is:

1. A frequency-division circuit comprising a pair of multi-state circuits being arranged to provide respective signals that transition at different frequency-divided rates and being arranged to be switched throughout a cycle of states, one multi-state circuit being arranged to switch to a next state in response to a rising edge in an input signal, the other multi-state circuit being arranged to switch to a next state in response to a falling edge in the input signal each multi-state circuit having at least one state in which the multi-state circuit inhibits the other multi-state circuit so as to prevent the other multi-state circuit from switching to the next state.

2. A frequency-division circuit as claimed in claim 1, wherein the frequency-division circuit comprises an output circuit coupled to receive an output signal from each multi-state circuit the output circuit being arranged to derive a processed output signal from the respective output signals of the multi-state circuits.

3. A frequency-division circuit as claimed in claim 2, wherein the output circuit comprises a first and a second latch circuit each having a data input a clock input an output (q), and an inverted output (q-), the clock input of the first latch circuit being coupled to receive an output signal of one multi-state circuit the clock input of the second latch circuit being coupled to receive an output signal of the other multi-state circuit, the data input of the first latch circuit being coupled to the inverted output of the second latch circuit the data input of the second latch circuit being coupled to the output of the first latch circuit.

4. A frequency-division circuit as claimed in claim 2, wherein the output circuit comprises a logic-gate circuit.

5. A frequency-division circuit as claimed in claim 1, wherein each multi-state circuit comprises a switchable latch circuit having a switch control input and being arranged not to change state when an inhibit signal is present at the switch control input.

6. A frequency-division circuit as claimed in claim 1, wherein each multi-state circuit comprises differential pairs arranged to receive and to provide differential signals.

7. A method of frequency division that employs a pair of multi-state circuits, the method comprising:
a rising-edge state-switching step in which one multi-state circuit switches throughout a cycle of states the one multi-state circuit switching to a next state in response to a rising edge in an input signal the one multi-state circuit having at least one state in which the other multi-state circuit is prevented from switching state; and
a falling-edge state-switching step in which the other multi-state circuit switches throughout a cycle of states the other multi-state circuit switching to a next state in response to a falling edge in the input signal the other multi-state circuit having at least one state in which the one multi-state circuit is prevented from switching state, wherein each of the multi-state circuits provide respective signals that transition at different frequency-divided rates.

8. A signal processing arrangement comprising a frequency-division circuit as claimed in claim 1, the signal processing arrangement further comprising:
an oscillator circuit for providing an oscillator signal that constitutes the input signal of the frequency-division circuit;
a mixer-driver circuit for deriving a mixer signal from the pair of multi-state circuits; and
a mixer circuit for mixing a signal to be processed with the mixer signal.

9. An information-rendering apparatus comprising a signal processing arrangement as claimed in claim 8, and an information-rendering device for rendering information that the signal processing arrangement has derived from the input signal.

10. A signal processing arrangement comprising:
a frequency-division circuit having
a pair of multi-state circuits, each being arranged to
provide respective signals that transition at different frequency-divided rates,
be switched throughout a cycle of states in response to a rising edge in an input signal,
switch to a next state in response to an opposing-direction transition edge of the input signal, relative to the direction of the transition edge to which the other of the pair of multi-state circuits responds, and
mitigate power consumption by operating in at least one state in which the multi-state circuit inhibits the other multi-state circuit from switching to the next state;
an oscillator circuit for providing an oscillator signal that constitutes the input signal of the frequency-division circuit;
a mixer-driver circuit for deriving a mixer signal from the pair of multi-state circuits; and
a mixer circuit for mixing a signal to be processed with the mixer signal, wherein each of the multi-state circuits is arranged for providing respective signals that transition at different frequency-divided rates.

11. An information-rendering apparatus comprising a signal processing arrangement as claimed in claim 10, and an information-rendering device for rendering information that the signal processing arrangement has derived from the input signal.

12. A frequency-division circuit as claimed in claim 1, wherein the frequency-division circuit comprises an output circuit coupled to receive an output signal from each multi-state circuit the output circuit being arranged to derive a processed output signal from the respective output signals of the multi-state circuits, and wherein each of the pair of multi-state circuits is arranged to mitigate power consumption by inhibiting the other multi-state circuit from switching to the next state.

* * * * *